(12) United States Patent
Wortman et al.

(10) Patent No.: US 6,608,766 B2
(45) Date of Patent: Aug. 19, 2003

(54) INTEGRATED EMI-SHIELD-AND-BEZEL-RETENTION FEATURE FOR USE WITH ELECTRONIC DEVICES

(75) Inventors: Michael Leslie Wortman, Sacramento, CA (US); Stephan Karl Barsun, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/052,804

(22) Filed: Nov. 2, 2001

(65) Prior Publication Data

US 2003/0086250 A1 May 8, 2003

(51) Int. Cl.[7] .................................................. H05K 9/00
(52) U.S. Cl. ...................... 361/818; 361/759; 361/801; 361/747; 174/35; 220/324; 220/326
(58) Field of Search ................................ 361/818, 816, 361/800, 801, 759, 740, 732, 726, 747; 174/35, 51 R; 220/324, 326

(56) References Cited

U.S. PATENT DOCUMENTS 4,212,415 A * 7/1980 Neely ........................ 222/231
5,349,132 A * 9/1994 Miller et al. ............... 174/35 R
5,547,272 A * 8/1996 Paterson et al. .......... 312/223.2
5,699,601 A * 12/1997 Gilliam et al. ................ 29/278
6,111,760 A * 8/2000 Nixon ......................... 361/814
6,315,142 B1 * 11/2001 Kitamura et al. .......... 220/4.02

* cited by examiner

Primary Examiner—David Martin
Assistant Examiner—Hung Bui

(57) ABSTRACT

A bezel that includes a number of unitary EMI-shield-and-snap-retention features molded onto an inner surface of a bezel. The EMI-shield-and-snap-retention features partially fasten an EMI shield to the bezel, while also fastening the bezel to a snap attached to an equipment enclosure. Each feature contains two flanged and tapered guide strips flanking one or more ramp-shaped pieces. As the EMI shield is placed flat along the interior of the bezel, the flanged sections of the guide strips lie over top of the EMI shield, pressing the EMI shield against the interior of the bezel. As the bezel closes against the equipment enclosure, the tapered sections of the guide strips guide the snap up the ramp-shaped pieces. The snap gains tension ascending the ramp-shaped pieces. When the snap crests the ramps, tension is released in the snap, causing the convex tip of the snap to stay secured to the ramp-shaped pieces.

13 Claims, 5 Drawing Sheets

INTEGRATED EMI-SHIELD-AND-BEZEL-RETENTION FEATURE FOR USE WITH ELECTRONIC DEVICES

TECHNICAL FIELD

The present invention relates to bezels and electromagnetic interference ("EMI") shields for electronic devices, and, in particular, to features that partially fasten an EMI shield to a bezel, while also securing the bezel to an equipment enclosure.

BACKGROUND OF THE INVENTION

Typically, electronic devices are housed in standardized equipment enclosures. Many equipment enclosures include an outer housing that is supported by an inner rack. The inner rack commonly comprises a substantially rectilinear metal frame including several vertical columns, each provided with a plurality of mounting and alignment holes that permit the mounting of various components to the inner rack.

Many equipment enclosures also include a removable bezel that forms an aesthetic front face for the enclosure. The bezel may also shield internal components from environmental contaminants, such as moisture and dust, as well as shield the environment from noise generated by components within the enclosure. Removing the bezel provides access to components mounted within the enclosures in order to repair, replace, inspect, and perform maintenance tasks on the components.

One current method used to fasten bezels to equipment enclosures employs a snap-on fastening mechanism. A snap-on design generally incorporates a series of snaps, which are either spaced around the edge of the front face of an equipment enclosure or around the perimeter of the interior lip of the bezel. Each snap is fastened to a corresponding retention-apparatus on the interlocking surface.

Many snap-on designs employ a series of retention-features, on the surface of the bezel, for snap retention. Each retention-feature must be molded as part of the bezel. Thus, every additional feature increases mold complexity and tooling-time expense. Consequently, molded bezels incorporating a snap-on fastening mechanism are expensive and time-consuming to manufacture.

Many electronic components generate electromagnetic radiation in the radio frequency ("RF") portion of the electromagnetic spectrum. RF-radiation generated by electronics is a common source of environmental electromagnetic interference ("EMI") that may degrade or impair operation of other electronic devices and circuits exposed to the RF-radiation. Increased use of electronic devices, especially mobile electronic devices, such as cellular phones, has increased environmental EMI levels. Consequently, EMI shields have been incorporated into equipment enclosures to block EMI from interfering with components within equipment enclosures, as well as to shield the environment from EMI generated by components within the enclosure.

Currently, many EMI shields are semi-permanently attached to bezels using fasteners and expensive and time-consuming post-mold heat-taking steps during the manufacturing process. In addition to EMI-shield attachment being slow and expensive, EMI-shield removal is tedious, and the risk of damage to the bezel is high. Recycling of EMI shield/bezel combinations requires the plastic bezel to be separated from the EMI shield, and is therefore expensive and time-intensive because of the semi-permanent post-mold heat-stake attachments. Attachment of EMI shields by semi-permanent, post-mold heat-staking steps also fails to provide an option for consumers to purchase a bezel assembly without a pre-installed EMI shield. Consumers purchasing electronic devices in a configuration not requiring an EMI shield must still purchase an equipment enclosure pre-assembled with an EMI shield to ensure adequate shielding for future upgrades.

Thus, manufacturers, designers, and consumers of electronic devices have recognized the need for a system allowing for simple, easily detachable attachment of an EMI shield to a bezel, and a bezel to an equipment enclosure.

SUMMARY OF THE INVENTION

In one embodiment of the present invention, one of more EMI-shield-and-snap-retention features are molded onto the inner lip of a bezel in a single mold. The snap-retention section of the EMI-shield-and-snap-retention feature comprises two guide strips and two ramp-shaped pieces that receive a snap, which is attached to an equipment enclosure. As the bezel reaches a final, flush position against the equipment enclosure, the two guide strips guide the convex tip of the snap up the ramp-shaped pieces. The ramps increase the displacement of the snap, causing a build-up of tension within the snap. When the convex tip of the snap passes over the back edge of the ramp-shaped pieces, displacement of the snap is reduced. Thus, tension is released within the snap, and the tip of the snap stays secured to the back edge of the ramp-shaped pieces.

The EMI-shield-retention section of the EMI-shield-and-snap-retention feature, comprising the two guide strips, partially fastens an EMI shield to the bezel. Each guide-strip further comprises a flanged section and a tapered section. The flanged section extends along the outer edge of the inner lip of the bezel, while the tapered section extends across the inner lip, from the outer edge to the major inner surface of the bezel. As the EMI shield is placed flat along the major inner surface of the bezel, a notch, cut from one edge of the EMI shield, slides around the tapered section of the guide strips, and under the flanged section. The flanged section presses the EMI shield against the major inner surface of the bezel, thus securing a portion of the EMI shield against the bezel. Thus, the embodiment of the present invention embodies a single, molded EMI-shield-and-snap-retention feature incorporating a multiplicity of different functions, thereby reducing tool complexity and cost and improving reliability.

DETAILED DESCRIPTION OF THE INVENTION

Figure 1:
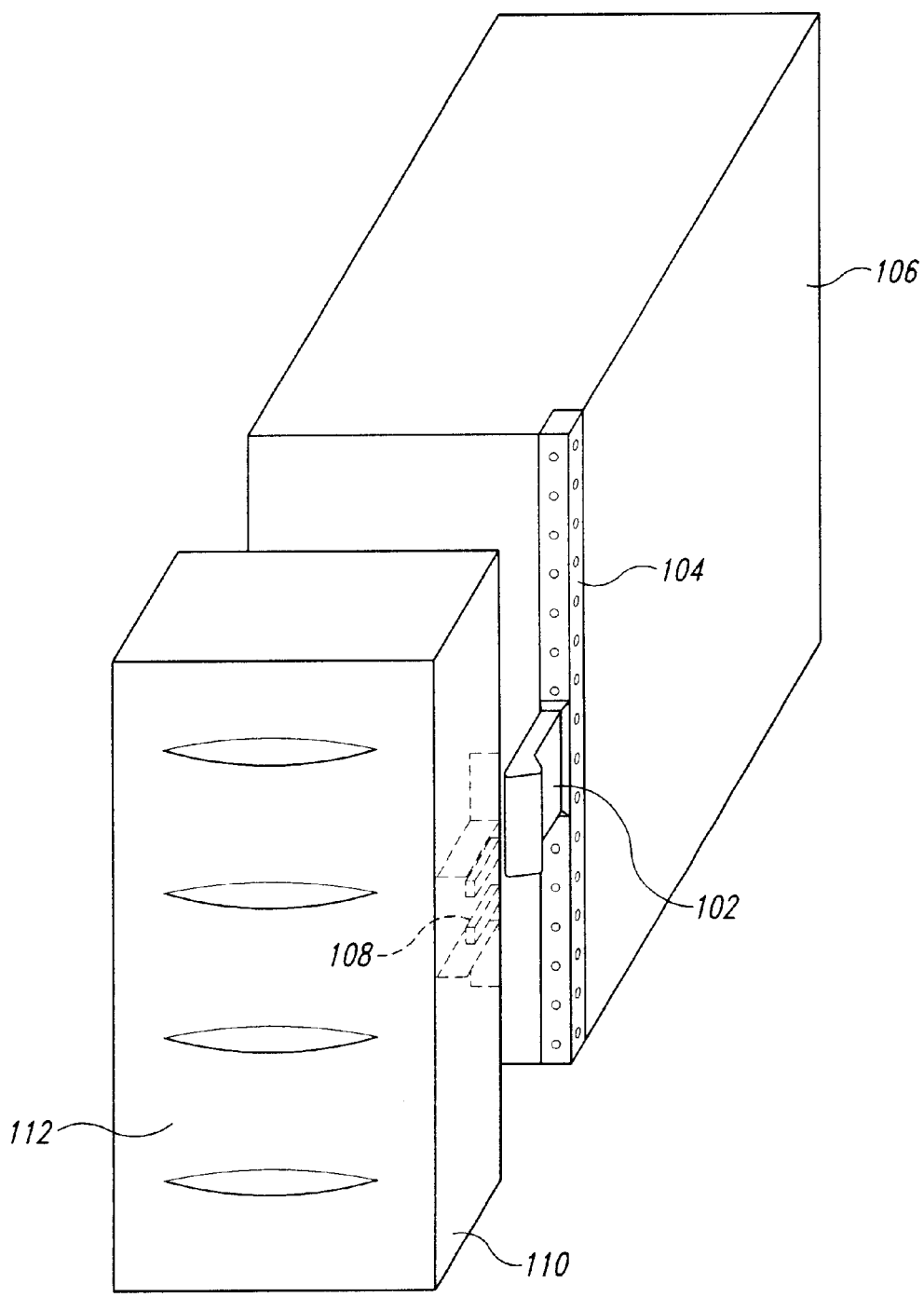
FIG. 1 is a perspective view of a bezel containing an EMI-shield-and-snap-retention feature, and an equipment enclosure containing a snap.

In one embodiment of the present invention, shown in FIGS. 1–6, one or more integrated EMI-shield-and-snapretention features are molded onto the interior of a bezel with a single lifter. FIG. 1 is a perspective view of a bezel containing an EMI-shield-and-snap-retention feature and an equipment enclosure containing a snap. The EMI-shield-and-snap-retention feature 108 is molded onto the inner lip 110 of the bezel 112. The snap 102, compatible with the snap-retention section of the EMI-shield-and-snap-retention feature 108, is shown anchored to the front face of a vertical column 104 in an equipment enclosure 106. The snap 102 protrudes outward, away from the front face of the equipment enclosure 106, enabling the snap 102 to fasten to the EMI-shield-and-snap-retention feature 108. Note that the size of the snap and the EMI-shield-and-snap-retention feature are enlarged for clarity. Several EMI-shield-and-snap-retention features may be necessary to fully fasten the bezel to the equipment enclosure, depending on the size and shape of the bezel, and whether an additional type of fastening mechanism is employed. Also note that only one vertical column is shown in the equipment enclosure, for clarity of illustration. An equipment enclosure commonly includes at least three additional vertical columns.

Figure 2:
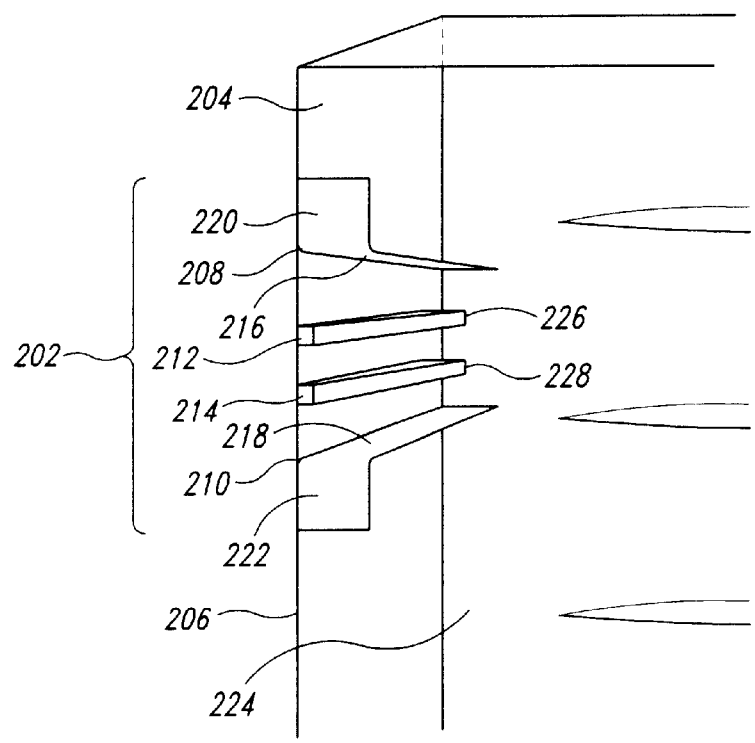
FIG. 2 is a close-up, perspective view of an EMI-shield-and-snap-retention feature molded onto the inner lip of a bezel.

FIG. 2 shows a close-up, perspective view of an EMI-shield-and-snap-retention feature molded onto the inner lip of the bezel. The EMI-shield-and-snap-retention feature 202 comprises a snap-retention section 212,214,216, and 218 and an EMI-shield-retention section 216,218,220, and 222. The snap-retention section 212,214,216, and 218 of the EMI-shield-and-snap-retention feature 202 comprises two guide strips 208,210 flanking two parallel, ramp-shaped pieces 212,214, or ramps. Each guide strip 208,210 comprises two sections, a flanged section 220,222 and a tapered section 216,218. The two, flanged sections 220,222 extend along the outer edge of the inner lip 204, before bending inward towards the major inner surface 224 of the bezel 206 along the two tapered sections 216,218.

The tapered sections 216,218 of the guide strips 208,210 extend across the inner lip 204 to the major inner surface 224, creating a slightly tapered space along the inner lip 204, and in-between the tapered sections 216,218. The space tapers from the outer edge of the inner lip 204 to the major inner surface 224, serving as a guide that corrects small misalignments between the bezel 206 and the equipment enclosure as the bezel 206 is fastened to the equipment enclosure.

The two ramp-shaped pieces 212,214, spaced between the two guide strips 208,210, rise away from the flanged sections 220,222 of the guide strips 208,210. The ramp-shaped pieces 212,214 rise from the outer edge of the inner lip 204 towards the major inner surface 224 of the bezel 206. The tapered sections 216,218 of the guide strips 208,210 extend all the way across the inner lip 204 of the bezel 206 to the major inner surface 224 of the bezel 206, whereas the ramp-shaped pieces 212,214 are shorter in length, and do not extend to the major inner surface 224. The space present between the back edges 226,228 of the ramp-shaped pieces 212,214 and the major inner surface 224, makes room for the tip of the snap, which fastens to the back edges of the ramp-shaped pieces when the bezel 206 is fastened to the equipment enclosure.

Figure 3:
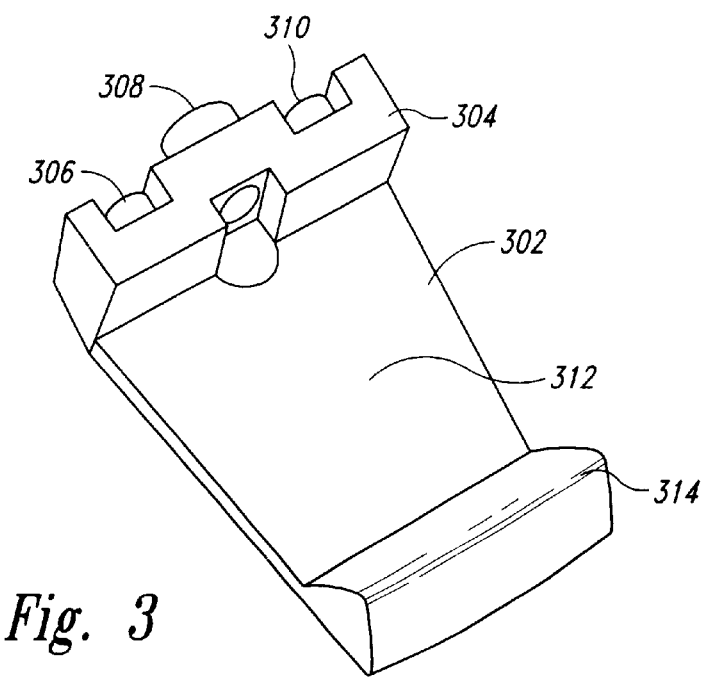
FIG. 3 is a perspective view of one possible snap compatible with a snap-retention section of a feature.

FIG. 3 is a perspective view of one possible snap 302 compatible with the snap-retention section of the EMI-shield-and-snap-retention feature. The snap 302 comprises a notched base 304 with three screw holes 306, 308, and 310, and a flat, tapered tongue 312 extending to a convex tip 314. The notched base 304 and screw holes 306, 308, and 310 facilitate attachment of the snap 302 to a vertical column on the front face of the equipment enclosure.

Figure 4A:
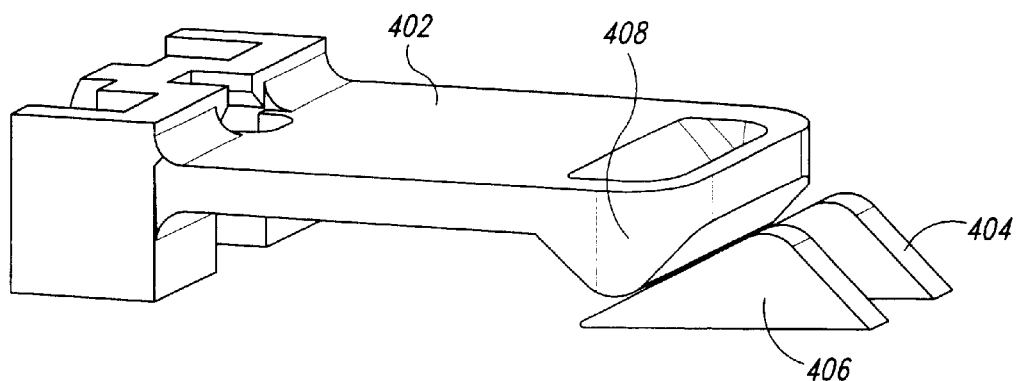
FIG. 4A is a perspective view of a snap before climbing two ramp-shaped pieces.

As the bezel is fastened to the equipment enclosure, the tapered tongue of the snap aligns with the guide strips of the snap-retention section of the EMI-shield-and-snap-retention feature. The guide strips guide the firmly anchored snap up the two ramp-shaped pieces between the guide strips. FIG. 4A is a perspective view showing the snap 402 before ascending the two ramp-shaped pieces 404,406. The snap 402 is oriented so that the convex tip 408 faces the ramp-shaped pieces 404,406. Ascension of the two ramps 404,406 causes tension to build in the snap 402 as a result of increased displacement of the tip of the snap 408 from the original projection of the snap 402 from the equipment enclosure. The convex shape of the tip 408 further accentuates the displacement and the corresponding tension. The angle of the incline of the ramp-shaped pieces 404,406 determines the amount of force necessary to displace the snap 402. The steeper the angle, the more force that is necessary. Thus, the steeper the incline of the ramps, the more force required to fasten the snap 402 to the ramp-shaped pieces 404,406.

Figure 4B:
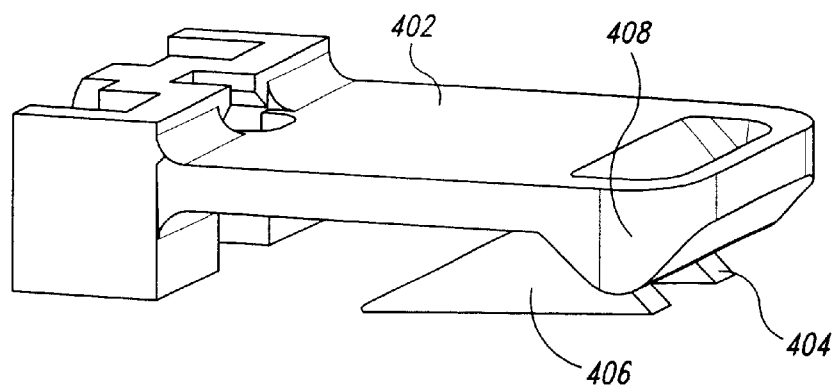
FIG. 4B is a perspective view of a snap after cresting two ramp-shaped pieces.

FIG. 4B is a perspective view showing the snap 402 after cresting the ramp-shaped pieces 404,406. When the convex tip 408 of the snap 402 passes over the top of the ramp-shaped pieces 404,406, the displacement of the snap 402 is significantly reduced. Consequently, tension in the snap 402 is reduced, and the convex tip 408 of the snap 402 stays secured to the back edges of the ramp-shaped pieces 404, 406.

Figure 5:
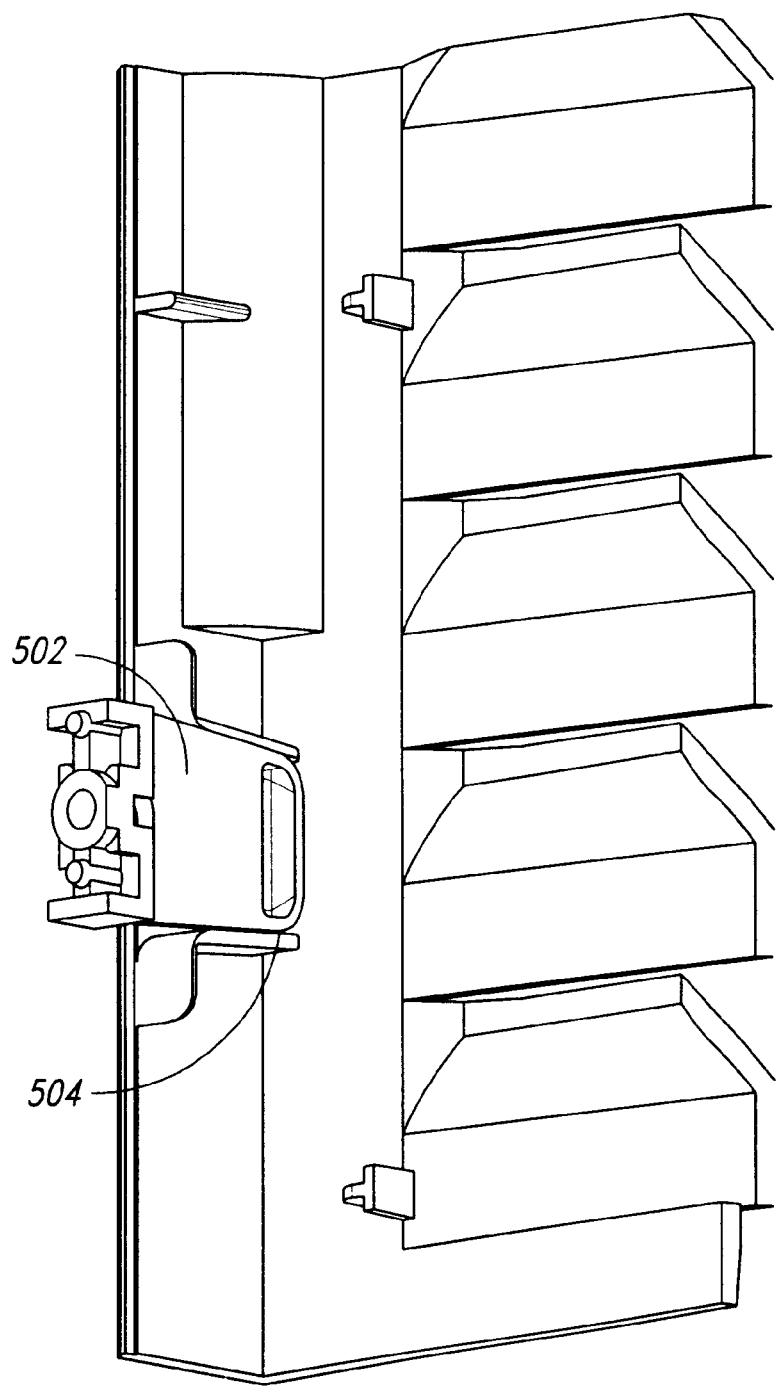
FIG. 5 is a perspective view showing a snap fastened to a snap-retention section of an EMI-shield-and-bezel-retention feature.

FIG. 5 shows the snap 502 fastened to the snap-retention section of the feature 504. Note that the length and width of the space between the guide strips generally corresponds with the length and width of the snap 502. Also note that several features may be necessary to fully fasten one length of the bezel to the equipment enclosure.

Figure 6:
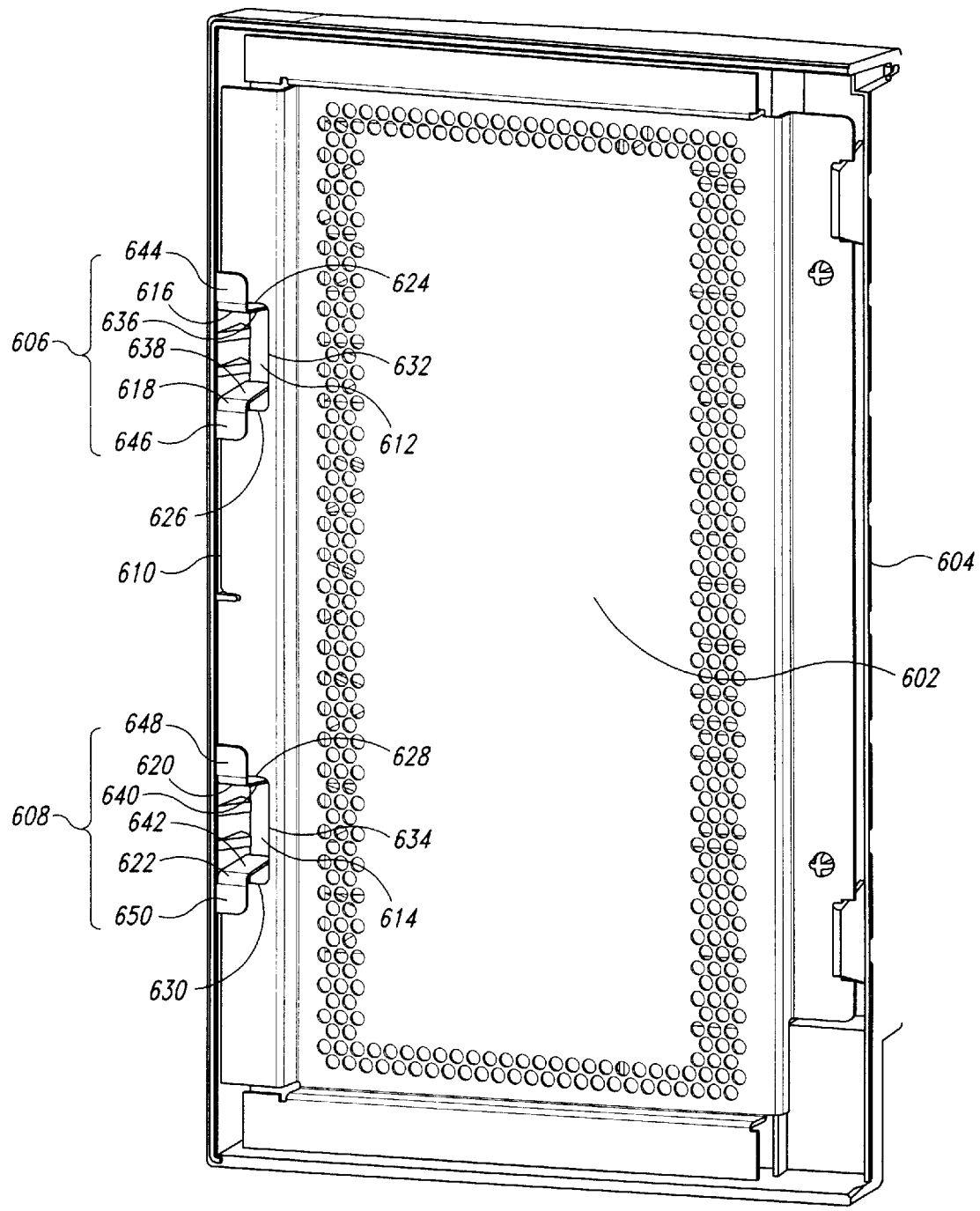
FIG. 6 is a perspective view illustrating an EMI shield fastened to a bezel, in part, by two EMI-shield-and-snap-retention features.

FIG. 6 is a perspective view showing an EMI shield fastened to the bezel. Two EMI-shield-and-snap-retention features 606,608 are shown along the left inner lip 610 of the bezel 604. The EMI shield 602 contains two notches 612, 614. Each notch 612,614 corresponds to the size, shape, and position of each EMI-shield-and-snap-retention feature 606, 608 on the bezel 604. The horizontal lengths 624,626,628, and 630 of the notches 612,614 are generally the same width as the guide strips 616, 618,620, and 622. The vertical lengths 632,634 of the notches 612,614 are generally the distance between the guide strips 616,618,620, and 622 at a point in-between the tapered section 636,638,640, and 642 and the flanged section 644,646,648, and 650 of each guide strip 616,618,620, and 622. The tapering of the guide strips 616,618,620, and 622 promotes a snug fit between the notched EMI shield 602 and the bezel 604 by allowing variable positioning of the notches 612,614 against the guide strips 616,618,620, and 622, thus accounting for small variances in the EMI-shield-and-snap-retention features 606,608 and the EMI shield 602.

Proper placement of the EMI shield 602 on the bezel 604 requires that the edge of the EMI shield 602 containing the notches 612,614 slide into the inner lip of the bezel 604 containing the EMI-shield-and-snap-retention features 606, 608. The notches 612,614 slide around the tapered sections 636,628,640, and 642 of the guide strips 616,618,620, and 622, and under the flanged sections 644,646,648, and 650, until the edge of the EMI shield 602 containing the notches 612,614, contacts the inner lip of the bezel 604. Once the EMI shield 602 is lying flat against the major inner surface of the bezel 604 and under the flanged sections 644,646,648, and 650 of the guide strips 616,618,620, and 622, the EMI shield 602 becomes partially restrained. The flanged sections 644,646,648, and 650 press the EMI shield 602 firmly against the major inner surface of the bezel 604, thus fastening a portion of the EMI shield 602 to the bezel 604. Note that, further attachments are necessary to fully fasten the EMI shield 602 to the bezel 604.

Although the present invention has been described in terms of a particular embodiment, it is not intended that the invention be limited to this embodiment. Modifications within the spirit of the invention will be apparent to those skilled in the art. For example, the material used to construct the EMI-shield-and-snap-retention feature and the snap may vary. Generally, the EMI-shield-and-snap-retention feature is made from the same material as the bezel. In most cases, plastic can be used. The size and number of EMI-shield-and-snap-retention features can vary depending on the size and shape of the equipment enclosure. Furthermore, the exact shapes and numbers of the different pieces of the EMI-shield-and-snap-retention feature may vary as well. For instance, a EMI-shield-and-snap-retention feature need not have exactly two ramp-shaped pieces. Moreover, the incline of the ramp-shaped pieces may vary depending on the predetermined amount of force desired to fasten the bezel to the equipment enclosure. The angle of the tapering of the guide strips may also vary. Different types of snaps may require a different guide-strip angling. Different surface locations may be used to attach the snap or EMI-shield-and-snap-retention feature. For instance, EMI-shield-and-snap-retention features may be molded to a horizontal length of the inner lip of the bezel instead of a vertical length. Additionally, EMI-shield-and-snap-retention features may be molded onto several different lengths of the inner lip of the bezel. The bezel-retention mechanism of the present invention may be used by itself, or in conjunction with other bezel-retention mechanisms, for instance, a sliding-mechanism, or a hinged-mechanism.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. An EMI-shield-and-bezel-retention system for mounting bezel to an equipment enclosure while securing an EMI shield to the bezel, the system comprising:
   a snap mounted to the equipment enclosure, the snap having a tapered tongue ending in a convex tip; and
   an EMI-shield-and-snap-retention feature molded onto the bezel, the EMI-shield-and-snap-retention feature including guide strips and ramps for receiving the snap, and, as the snap is pushed inward into the EMI-shield-and-snap-retention feature, increasingly displacing the snap and increasing tension within the tapered tongue as the convex tip rides up the ramps, and securing the snap when the convex tip snaps behind the ramps, releasing tension within the tapered tongue.

2. The EMI-shield-and-bezel-retention system of claim 1 wherein the EMI-shield-and-snap-retention feature is molded onto the bezel in a single mold.

3. The EMI-shield-and-bezel-retention system of claim 1 wherein the bezel includes an inner lip and a major inner surface.

4. The EMI-shield-and-bezel-retention system of claim 3 wherein the guide strips further comprise a tapered section and a flanged section.

5. The EMI-shield-and-bezel-retention system of claim 4 wherein the flanged section of each guide strip extends along an outer edge of the inner lip of the bezel.

6. The EMI-shield-and-bezel-retention system of claim 4 wherein the tapered section of each guide strip extends across the inner lip of the bezel from the major inner surface to an outer edge of the inner lip.

7. The EMI-shield-and-bezel-retention system of claim 4 wherein the EMI-shield-snap-retention feature includes two guide strips, the guide strips extending across the inner lip such that the guide strips create a tapered space between the two guide strips, the space tapering from an outer edge of the inner lip to the major inner surface.

8. The EMI-shield-and-bezel-retention system of claim 7 wherein the snap-retention feature further includes at least one ramp molded onto the bezel in the tapered space.

9. The EMI-shield-and-bezel-retention system of claim 8 wherein each ramp rises from an outer edge of the inner lip of the bezel.

10. A method for fastening a bezel to an equipment enclosure while also securing an EMI shield to the bezel, the method comprising:
    mounting a snap to the equipment enclosure, the snap having a convex tip;
    molding an EMI-shield-and-snap-retention feature to the bezel, the EMI-shield-and-snap-retention feature including one or more ramps, each ramp having a back edge, and one or more guide strips, each guide strip having a flanged section;
    securing the EMI shield to the bezel by sliding the EMI shield underneath the flanged section of each guide strip; and
    fastening the bezel to the equipment enclosure by pressing the EMI-shield-and-snap-retention feature onto the snap so that the convex tip of the snap climbs the ramps and the tip of the snap descends in contact with the back edges of the ramps in order to secure the snap within the EMI-shield-and-snap-retention feature.

11. The method of claim 10 wherein molding the EMI-shield-and-snap-retention feature to the bezel further comprises molding the EMI-shield-and-snap-retention feature to the bezel in a single mold.

12. A method for providing an EMI-shield-retention mechanism and a bezel-fastening mechanism within an equipment enclosure, the method comprising:
    mounting a snap to the equipment enclosure; and
    molding an EMI-shield-and-snap-retention feature to the bezel, the EMI-shield-and-snap-retention feature including one or more guide strips, each guide strip containing a flanged section, and one or more ramps;
    securing the EMI shield to the bezel by positioning the guide strips on the bezel such that, when an EMI shield is placed against the bezel, the EMI shield is held between the bezel and the flanged section each guide strip; and
    mounting the EMI shield/bezel combination to the equipment enclosure by positioning the ramps on the bezel such that, when the bezel is closed, the EMI-shield-and-snap-retention feature engages and secures the snap, thereby securing the bezel to the equipment enclosure.

13. The method of claim 12 wherein molding the EMI-shield-and-snap-retention feature to the bezel further comprises molding the EMI-shield-and-snap-retention feature to the bezel in a single mold.

* * * * *